United States Patent
Haga

(10) Patent No.: US 6,802,043 B2
(45) Date of Patent: Oct. 5, 2004

(54) SEMICONDUCTOR DEVICE HAVING A FUNCTION BLOCK PROVIDED IN A MACRO AND OPERATING INDEPENDENTLY OF THE MACRO AND METHOD FOR DESIGNING THE SAME

(75) Inventor: Ryo Haga, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 198 days.

(21) Appl. No.: 10/107,159

(22) Filed: Mar. 28, 2002

(65) Prior Publication Data

US 2002/0140454 A1 Oct. 3, 2002

(30) Foreign Application Priority Data

Mar. 29, 2001 (JP) ........................................ 2001-096676

(51) Int. Cl.⁷ ............................. G06F 17/50; G06F 7/38; G06F 9/45; G11C 7/00; H01L 27/10
(52) U.S. Cl. ................................ 716/1; 716/8; 716/10; 365/200; 257/202; 326/40
(58) Field of Search .................. 716/8, 1, 10; 365/200; 257/202; 326/40

(56) References Cited

U.S. PATENT DOCUMENTS

| | | | | |
|---|---|---|---|---|
| 5,698,876 A | * | 12/1997 | Yabe et al. | ................. 257/296 |
| 6,340,897 B1 | * | 1/2002 | Lytle et al. | .................... 326/40 |
| 6,426,908 B1 | * | 7/2002 | Hidaka | ........................ 365/222 |
| 6,473,352 B2 | * | 10/2002 | Nishino et al. | ............. 365/219 |
| 6,535,999 B1 | * | 3/2003 | Merritt et al. | ................. 714/30 |
| 6,556,490 B2 | * | 4/2003 | Shubat et al. | ................ 365/200 |
| 6,560,740 B1 | * | 5/2003 | Zuraski, Jr. et al. | ........ 714/733 |
| 2002/0097623 A1 | * | 7/2002 | Suzuki et al. | ................ 365/210 |
| 2003/0030073 A1 | * | 2/2003 | Saotome et al. | ............ 257/202 |

OTHER PUBLICATIONS

R. Haga et al., Interface Socket design Methodology to Generate Embedded DRAM Macros, IEEE 2001 Custom Integrated Circuits Conference, pp. 537–540, May 2001.*

T. Yabe et al., A Configurable DRAM Macro Design for 2112 Derivative Organizaitons to be Synthesized Using a Memory Generator, 1998 IEEE International Solid–State Circuits Conference, pp. 72–73, 415, Feb. 1998.*

Michael R. Ouellette, et al. "Shared Fuse Macro for Multiple Embedded Memory Devices with Redundancy," IEEE 2001 Custom Integrated Circuits Conference, 2001, pp. 191–194.

* cited by examiner

Primary Examiner—A. M. Thompson
(74) Attorney, Agent, or Firm—Oblon, Spivak, McClelland, Maier & Neustadt, P.C.

(57) ABSTRACT

A semiconductor device includes first, second and third semiconductor circuits. The first semiconductor circuit has a first function. The second semiconductor circuit has a second function different from the first function. The third semiconductor circuit is provided in the second semiconductor circuit and has part of the first function. The third semiconductor circuit transmits/receives no signals to/from the second semiconductor circuit and operates independently of the second semiconductor circuit.

21 Claims, 14 Drawing Sheets

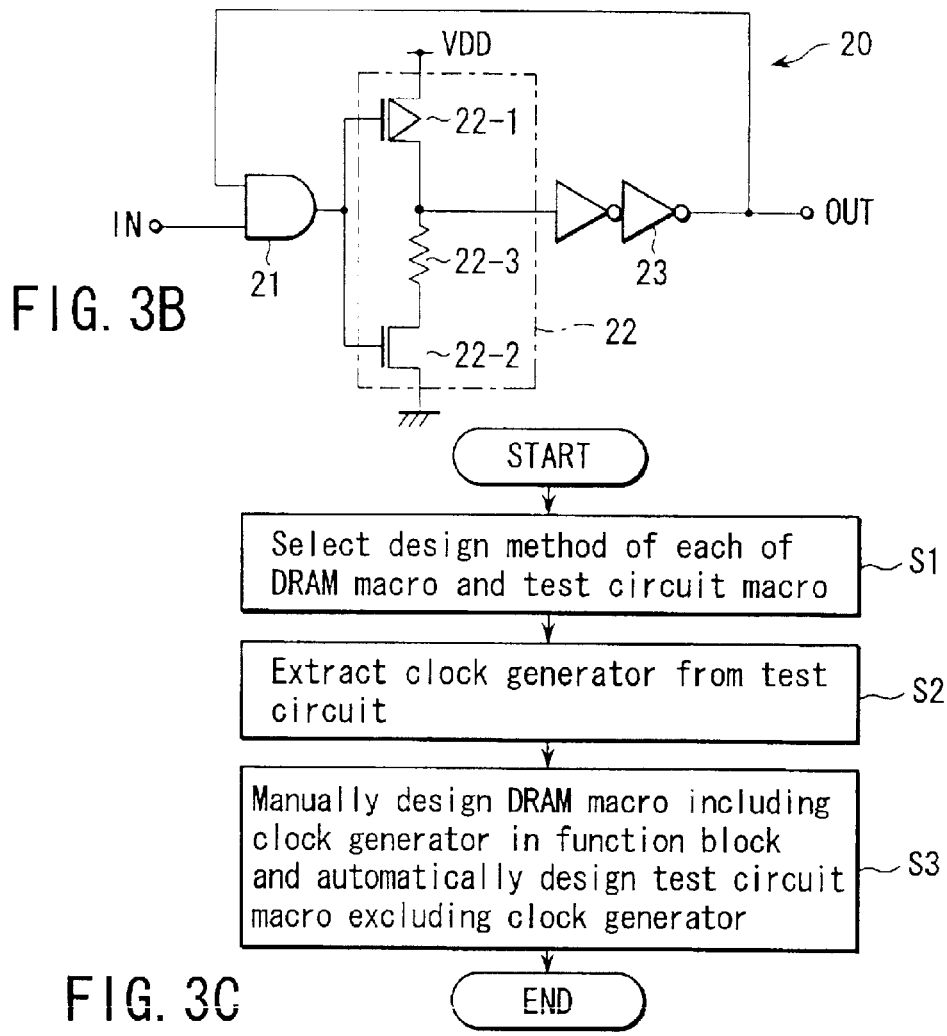
FIG. 3B
FIG. 3C
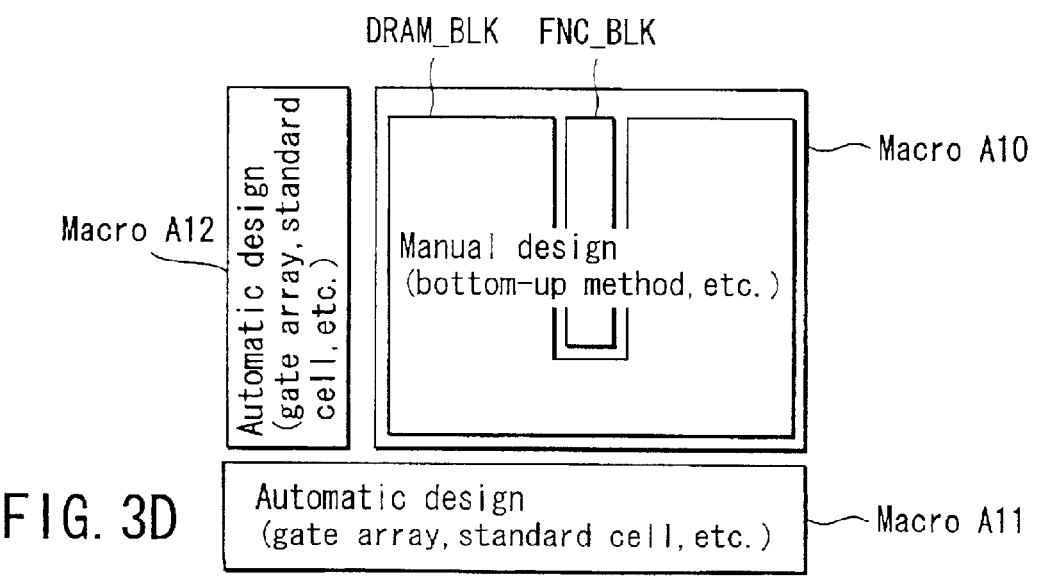
FIG. 3D

SEMICONDUCTOR DEVICE HAVING A FUNCTION BLOCK PROVIDED IN A MACRO AND OPERATING INDEPENDENTLY OF THE MACRO AND METHOD FOR DESIGNING THE SAME

CROSS-REFERENCE TO RELATED APPLICATIONS

This application is based upon and claims the benefit of priority from the prior Japanese Patent Application No. 2001-096676, filed Mar. 29, 2001, the entire contents of which are incorporated herein by reference.

BACKGROUND OF THE INVENTION

1. Field of the Invention

The present invention relates to a semiconductor device having a plurality of macros. More specifically, the invention relates to a technique to maintain reliability of signals transmitted in a semiconductor integrated circuit.

2. Description of the Related Art

A system LSI having a plurality of functions integrated on one chip has become a focus of attention in accordance with recent improvement in semiconductor manufacturing technique.

FIG. 1A is a schematic block diagram showing a configuration of a prior art system LSI. As shown in FIG. 1A, a system LSI 1 includes a plurality of macros A1 to A6 formed on a single semiconductor substrate. The "macro" means a collection of semiconductor elements and corresponds to a block that carries out a specific function by itself. More specifically, the system LSI includes macros such as an SRAM (static random access memory), a DRAM (dynamic random access memory), and a CPU (central processing unit). The macros A1 to A6 are connected to each other by connection wires and cooperate with each other, thereby fulfilling a function of the system LSI.

It is needless to say that a method of designing a macro may vary from macro to macro; however, one macro can be designed by a plurality of design methods. This case will be described with reference to FIG. 1B. FIG. 1B is a block diagram showing an internal structure of the macro A1 shown in FIG. 1A.

The macro A1 is a DRAM macro having a function related to the DRAM as illustrated in FIG. 1B. The DRAM macro A1 includes both a DRAM block DRAM_BLK and a test circuit block TEST_BLK. The DRAM block DRAM_BLK is an area including a circuit for carrying out a memory function of the DRAM. The test circuit block TEST_BLK is an area including a test circuit having a function that is unnecessary when a user uses the DRAM block DRAM_BLK but necessary when the DRAM block DRAM_BLK is tested during the manufacture of the DRAM macro A1.

The DRAM block DRAM_BLK is designed by a manual design method such as a bottom-up method. The test circuit block TEST_BLK in the same macro need not be designed particularly by the manual design method in terms of its circuit arrangement. The test circuit block TEST_BLK might therefore be designed by an automatic design method using, e.g., a standard cell. Using a standard cell, circuits can be synthesized on the RTL (register transfer level) and their layout can be designed by automatic layout wiring. Consequently, a time period for design can be shortened more than when the DRAM macro A1 is designed only by the bottom-up method.

An internal clock might be required when the test circuit conducts a test on the DRAM block DRAM_BLK. The test circuit block TEST_BLK therefore usually includes a clock generator. Since the clock generator is provided in the test circuit block TEST_BLK, it is designed by the automatic design method, too. However, a delay element is not generally included in a standard cell that is used as a library while automatic layout wiring is being performed by software. Delay time required for generating an internal clock is achieved by an inverter delay supplied by a plurality of inverters 2 connected in series, as shown in FIG. 1C. Thus, a great number of inverters 2 are required when the frequency of the internal clock is low, with the result that the area of the DRAM macro increases. If the inverters are used to cause a delay, delay time greatly varies with voltage and process variations and a clock becomes difficult to control exactly.

The macros A1 to A6 are connected to each other by connection wires. As illustrated in FIG. 1A, a buffer 3 is provided halfway through a connection wire to prevent the waveform of a signal transmitted through the connection wire from being dulled. In FIG. 1A, the macro A1 of large size is provided between the macros A2 and A6. A connection wire for connecting the macros A2 and A6 has to take a long detour through the macro A1. Consequently, a long delay is caused in a signal when the signal is transmitted through the connection wire, thereby decreasing the operation reliability of the system LSI. Since the connection wire has to take a long detour, the layout of macros becomes difficult to design in a system LSI having a number of connection wires. From this viewpoint, the connection wire that connects macros A2 and A6 may pass over the macro A1. This layout is shown in FIG. 2A. In this case, however, it is hard to insert a signal waveform-shaping buffer in a halfway portion of the connection wire. This is because the macro A1 is not formed even taking into consideration a connection wire that is to pass over the macro A1 itself. The waveform of a signal cannot be prevented from being dulled when the signal passes over the macro A1.

In order to arrange a connection wire over the macro A1, an area in which a metal wire necessary for forming the macro A1 is formed, needs to be predetermined as a wiring inhibit area, as shown in FIG. 2B. A connection wire passing over the macro (macro passing wire) needs to be laid out in a space area other than the wiring inhibit area. While the wiring density in the wiring inhibit area is very high, it becomes low in the other areas because the macro passing wire simply passes over the area. In other words, the wiring density may vary in the same macro. A problem therefore occurs in the process of manufacturing a metal wiring layer. It is likely that the process precision in a low-density wiring area deteriorates if the process is optimized in accordance with a high-density wiring area and the process precision in a high-density wiring area deteriorates if the process is optimized in accordance with a low-density wiring area.

BRIEF SUMMARY OF THE INVENTION

A semiconductor device according to an aspect of the present invention comprises:

a first semiconductor circuit having a first function;

a second semiconductor circuit having a second function different from the first function; and a third semiconductor circuit provided in the second semiconductor circuit and having part of the first function, the third semiconductor circuit transmitting/ receiving no signals to/from the second semiconductor circuit and operating independently of the second semiconductor circuit.

A method for designing a semiconductor device according to an aspect of the present invention comprises:

determining a first semiconductor circuit necessary for composing a first semiconductor circuit group which fulfils a first function and a plurality of second semiconductor circuits necessary for composing a second semiconductor circuit group which fulfils a second function;

selecting a second semiconductor circuit, which is to be designed by a same design method as that of the first semiconductor circuit group, from the second semiconductor circuit group; and designing the first semiconductor circuit group including the selected second semiconductor circuit by a first design method and designing the second semiconductor circuit group excluding the selected second semiconductor circuit by a second design method, the second design method differing from the first design method, and the second semiconductor circuit in the first semiconductor circuit group transmitting/receiving no signals to/from the first semiconductor circuit and being independent of the first semiconductor circuit.

BRIEF DESCRIPTION OF THE SEVERAL VIEWS OF THE DRAWING

FIG. 3B is a circuit diagram of a clock generator;

FIG. 3C is a flowchart showing a process of designing the system LSI according to the first embodiment of the present invention;

FIG. 3D is a block diagram of the system LSI according to the first embodiment of the present invention;

DETAILED DESCRIPTION OF THE INVENTION

Figure 1A:
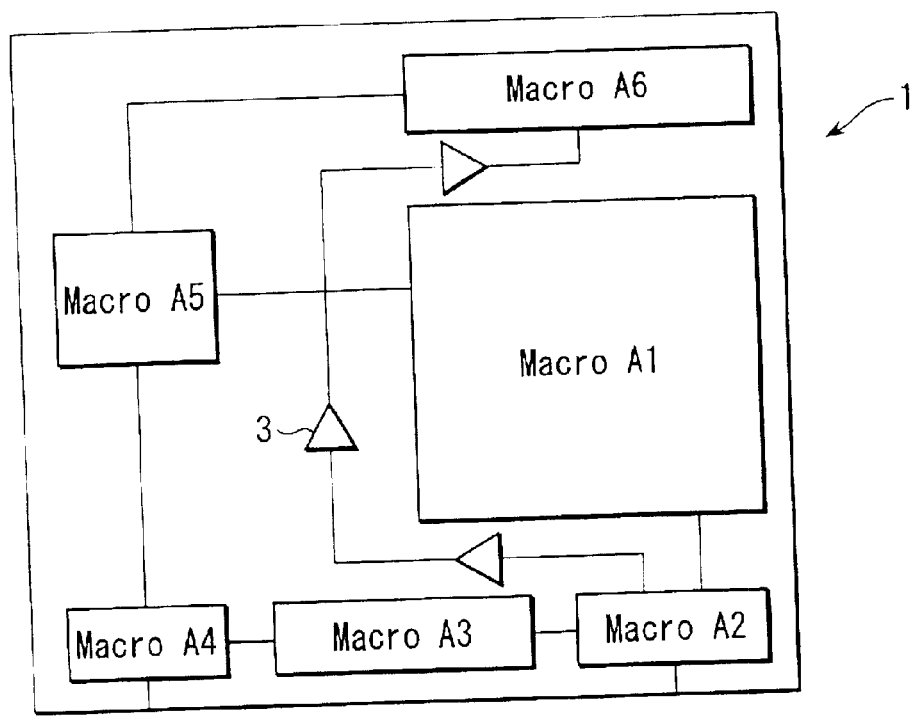
FIG. 1A is a block diagram of a prior art system LSI.
Figure 1B:
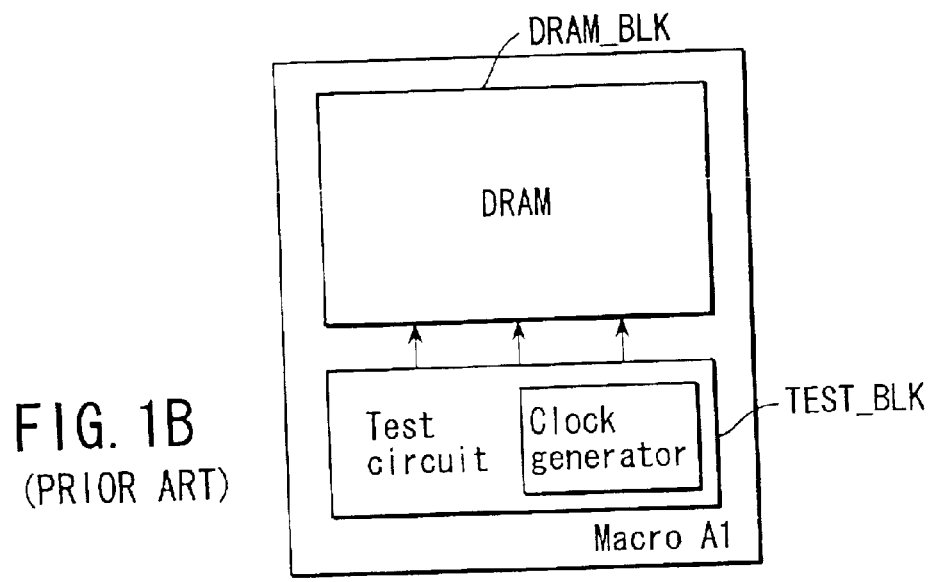
FIG. 1B is a block diagram of a prior art macro.
Figure 1C:
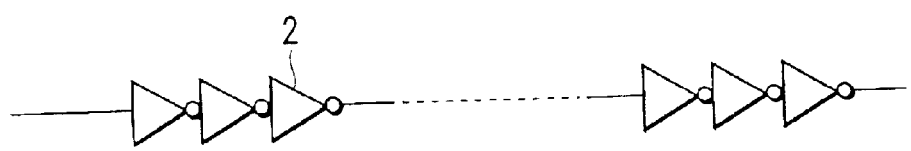
FIG. 1C is a circuit diagram of a delay circuit.
Figure 2A:
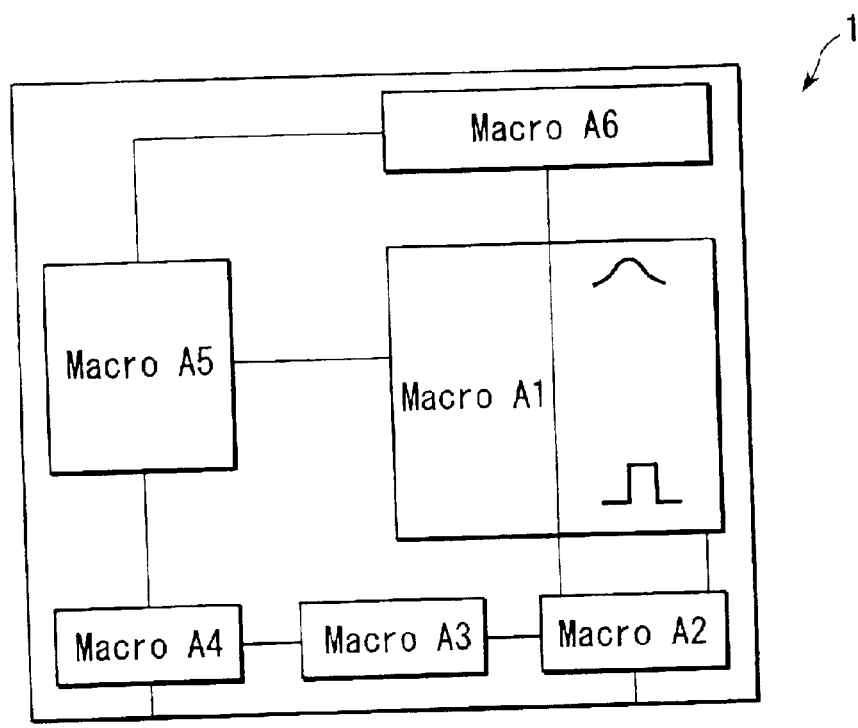
FIG. 2A is a block diagram of a prior art system LSI.
Figure 2B:
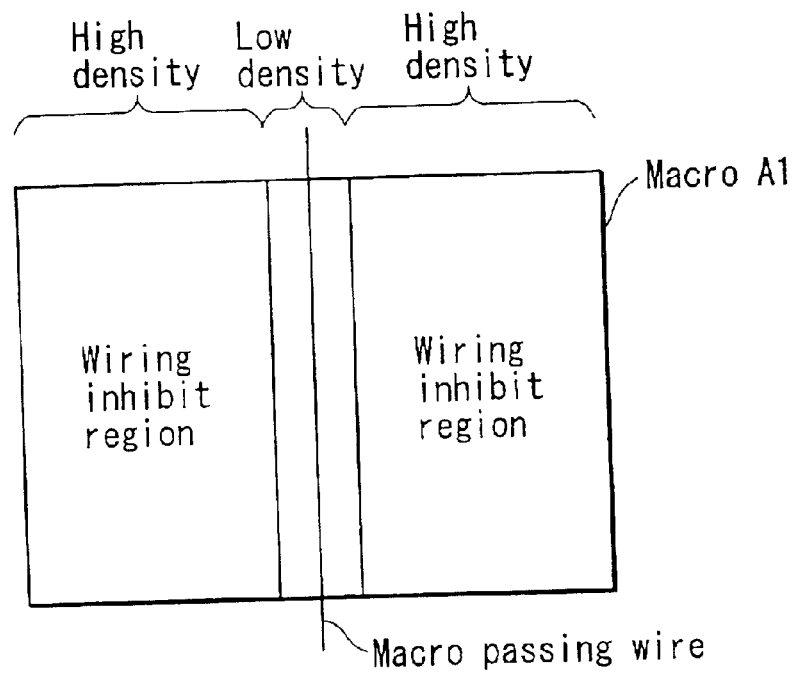
FIG. 2B is a block diagram of a prior art macro.
Figure 3A:
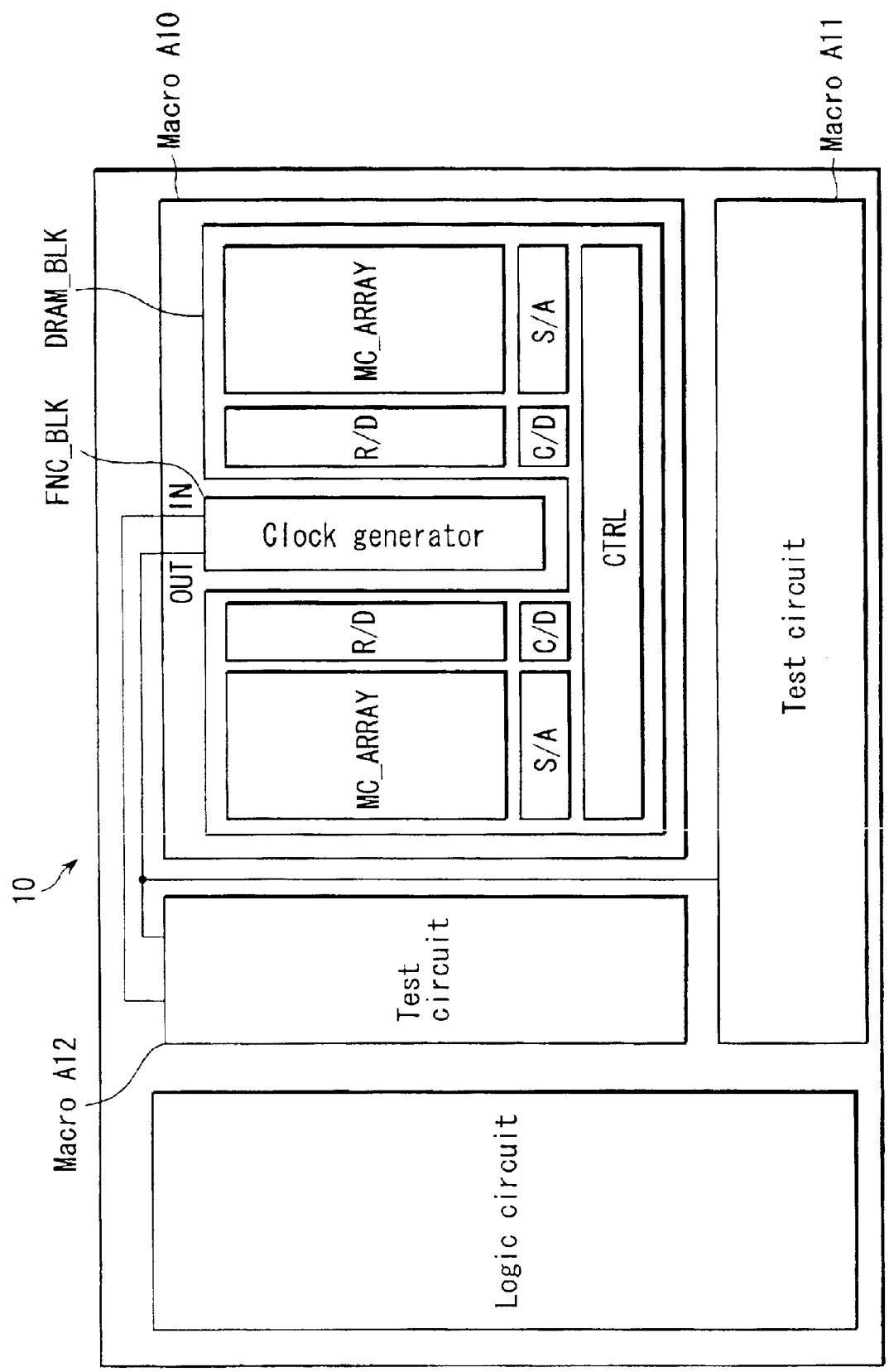
FIG. 3A is a block diagram of a system LSI according to a first embodiment of the present invention.

A semiconductor device according to a first embodiment of the present invention will now be described with reference to FIG. 3A. FIG. 3A is a block diagram of a system LSI 10.

As shown in FIG. 3A, the system LSI 10 includes a DRAM macro A10, test circuit macros A11 and A12, and a logic circuit. Each of the macros A10 to A12 is rectangular. The DRAM macro A10 is formed of a collection of circuits necessary for configuring a DRAM. In other words, the DRAM macro A10 includes both a DRAM block DRAM_BLK and a function block FNC_BLK. The DRAM block DRAM_BLK is a collection of components necessary for fulfilling a function of the DRAM. The DRAM block DRAM_BLK includes a memory cell array MC_ARRAY, a row decoder R/D, a column decoder C/D, a sense amplifier S/A, and a control circuit CTRL. The function block FNC_BLK is a collection of components for fulfilling a function that totally differs from that of the DRAM and includes a clock generator. The function block FNC_BLK is functionally completely independent of the DRAM block DRAM_BLK, and no signals are transferred between them. In other words, the function block FNC_BLK completes its own function (a function of the clock generator in this embodiment). The function block FNC_BLK has its unique input terminal IN and output terminal OUT. Thus, no signals input to/output from the DRAM block DRAM_BLK have an influence on the operation of the function block FNC_BLK. However, the function block FNC_BLK and DRAM block DRAM_BLK are functionally separated from each other and thus they can have a power supply in common.

The test circuit macros A11 and A12 are each formed as a collection of circuits necessary for testing the DRAM block DRAM_BLK in the DRAM macro A10 during the manufacture of the system LSI. At least one of the test circuit macros A11 and A12 transmits/receives signals to/from the function block FNC_BLK in the DRAM macro A10.

FIG. 3B is a circuit diagram showing one example of a clock generator 20 included in the function block FNC_BLK. Referring to FIG. 3B, the clock generator 20 includes an AND gate 21, a delay section 22, and inverters 23 and 23. The AND gate 21 has two input terminals each connected to an input node IN and output node OUT of the clock generator 20, respectively and an output terminal connected to an input node of the delay section 22. The delay section 22 includes a pMOS transistor 22-1, an nMOS transistor 22-2, and a resistance element 22-3. The pMOS transistor 22-1 includes a gate connected to the output terminal of the AND gate 21, a source connected to a power supply potential VDD, and a drain connected to one end of the resistance element 22-3. The nMOS transistor 22-2 has a gate connected to the output terminal of the AND gate 21, a source connected to a ground potential, and a drain connected to the other end of the resistance element 22-3. A connection node of the drain of the pMOS transistor 22-1 and the one end of the resistance element 22-3 serves as an output node of the delay section 22. The inverters 23 and 23 are arranged in series between the output node of the delay section 22 and the output node OUT of the clock generator 20.

An operation of the clock generator 20 with the above configuration will now be described. The clock generator 20 stops generating a clock when a signal input to the input node IN is set at a low level and starts doing it when the signal is set at a high level. When the input signal is set at a low level, the output of the AND gate becomes low in level. Thus, the pMOS transistor 22-1 turns on and the nMOS transistor 22-2 turns off, so that the output of the delay section 22 becomes high in level. Consequently, the signal output from the output node OUT of the clock generator 20 becomes high in level.

If the signal input to the input node IN is set at a high level in the foregoing state, the output of the AND gate 21 becomes high in level. Thus, the pMOS transistor 22-1 turns off and the nMOS transistor 22-2 turns on, so that the output signal of the delay section becomes low in level. Consequently, the signal output from the output node OUT of the clock generator 20 becomes low in level. As described above, the AND gate 21, delay section 22, and inverters 23, 23 function as a ring oscillator to generate an internal clock.

A process of designing the DRAM macro and the test circuit macros in the above system LSI will now be described with reference to FIG. 3C. FIG. 3C is a flowchart showing a process of designing each of the macros.

As shown in FIG. 3C, in step S1, the components of the DRAM macro A10 and test circuit macros A11 and A12 are determined and then a method of designing each of the macros A10 to A12 is selected. It is a memory cell array, a decoder and the like that correspond to the components of the DRAM macro A10. As has been described in the Background of the Invention, a manual design method such as a bottom-up method is selected as a method of designing the DRAM macro A10. On the other hand, an automatic design method using a gate array and a standard cell is selected as a method of designing the test circuit macros A11 and A12.

In step S2, a clock generator is extracted from the test circuit macros. This step means selecting a component, which is designed more favorably by the manual design method than by the automatic design method, from the macros designed by the automatic design method.

In step S3, the DRAM macro A10 and test circuit macros A11 and A12 are designed using the method selected in step S1. The DRAM macro A10 is so designed that the function block includes the clock generator extracted in step S2. The test circuit macros A11 and A12 are so designed as to exclude the clock generator.

Consequently, as illustrated in FIG. 3D, the DRAM macro A10 including the function block FNC_BLK and the DRAM block DRAM_BLK as a whole is designed by the manual design method. The test circuit macros A11 and A12 are designed by the automatic design method.

According to the DRAM macro of the first embodiment and its design method, the DRAM macro A10 comprises a function block FNC_BLK whose function is independent of that of a DRAM. The function block FNC_BLK includes a clock generator that is part of a test circuit. The entire DRAM macro A10 is designed by the manual design method. In the design of the clock generator, resistance and capacitor elements or transistor elements can be used as components of the clock generator. In other words, the circuit design, which was difficult to perform by the automatic design method using a standard cell and the like, can be done on the semiconductor-element level. As a result, delay time in the clock generator can exactly be controlled and the design precision of the clock generator can be increased. Since the circuit is designed on the semiconductor-element level, the number of semiconductor elements that composes a delay circuit in the clock generator can be decreased drastically and the clock generator can be downsized accordingly.

Not all the components of the clock generator shown in FIG. 3B need to be always provided in the function block FNC_BLK. This is because it is only the delay section 22 using the MOS transistors 22-1 and 22-2 and the resistance element 22-3 that is difficult to achieve by the automatic design method in the circuit arrangement shown in FIG. 3B. The other AND gate 21 and inverters 23 can be designed by the automatic design method. Therefore, only the delay section 22 can be extracted from the test circuit macros and designed in the function block FNC_BLK of the DRAM macro A10, while the AND gate 21 and inverters 23 can be designed in the test circuit macros A11 and A12.

Figure 4A:
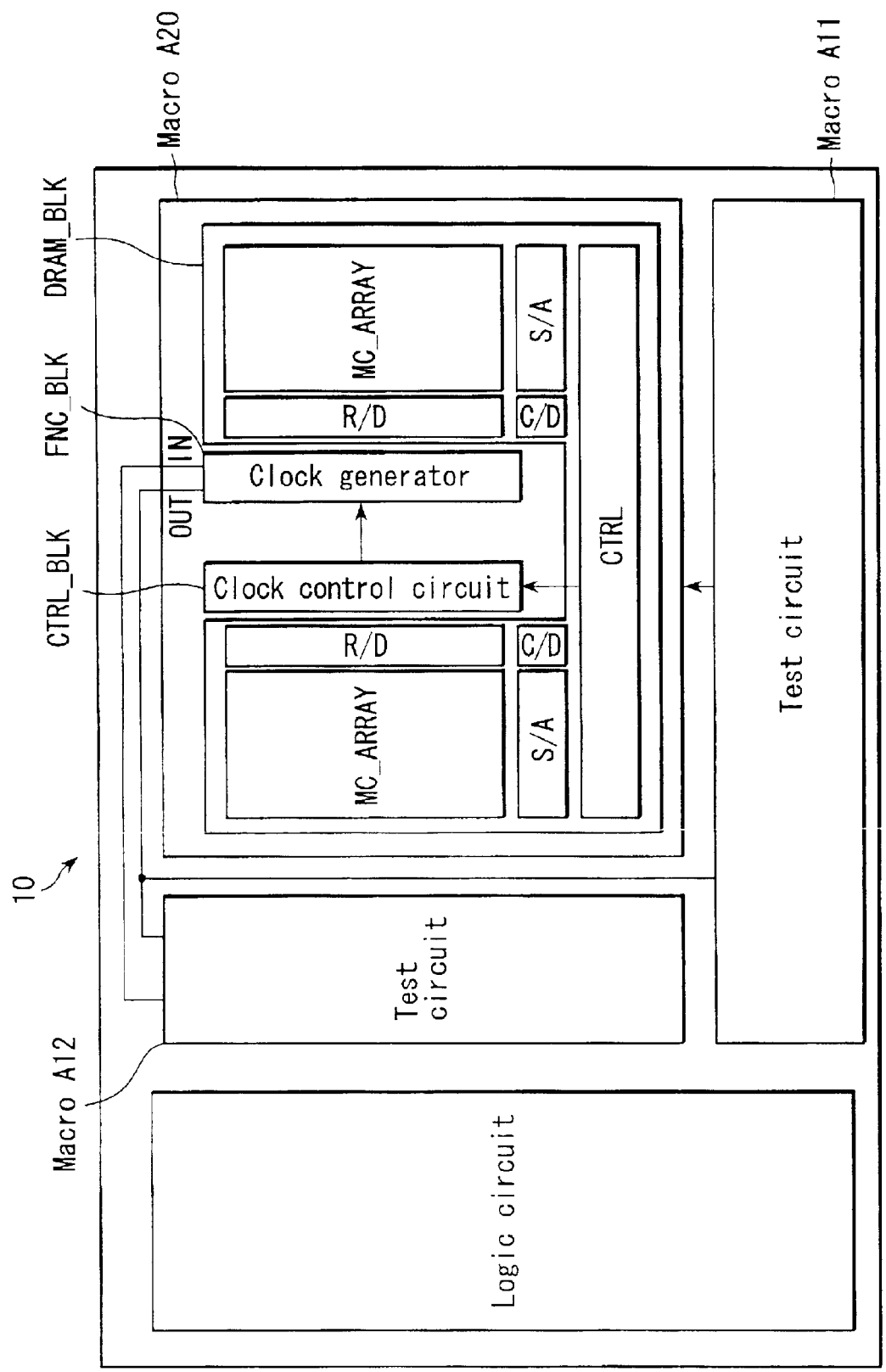
FIG. 4A is a block diagram of a system LSI according to a second embodiment of the present invention.

A semiconductor device according to a second embodiment of the present invention will now be described with reference to FIG. 4A. FIG. 4A is a block diagram of a system LSI 10 according to the second embodiment.

In the system LSI 10 shown in FIG. 4A, a DRAM macro A20, which corresponds to the DRAM macro A10 of the first embodiment, includes a clock control circuit block CTRL_BLK, and a DRAM block DRAM_BLK can control a function block FNC_BLK indirectly. As has been described in the above first embodiment, it is needless to say that no signals are directly transferred between the function block FNC_BLK and the DRAM block DRAM_BLK, whereas signals are transferred between the function block FNC_BLK and the clock control circuit block CTRL_BLK. The clock control circuit block CTRL_BLK receives a command signal from, e.g., a control circuit CTRL in the DRAM block DRAM_BLK and transmits a test command signal to the function block FNC_BLK. The clock control circuit block CTRL_BLK operates only when the DRAM macro A20 is tested. The function block FNC_BLK operates upon receipt of the test command signal from the clock control circuit block CTRL_BLK. In a normal operation, therefore, the function block FNC_BLK is not influenced by any signals of the DRAM macro A20.

Figure 4B:
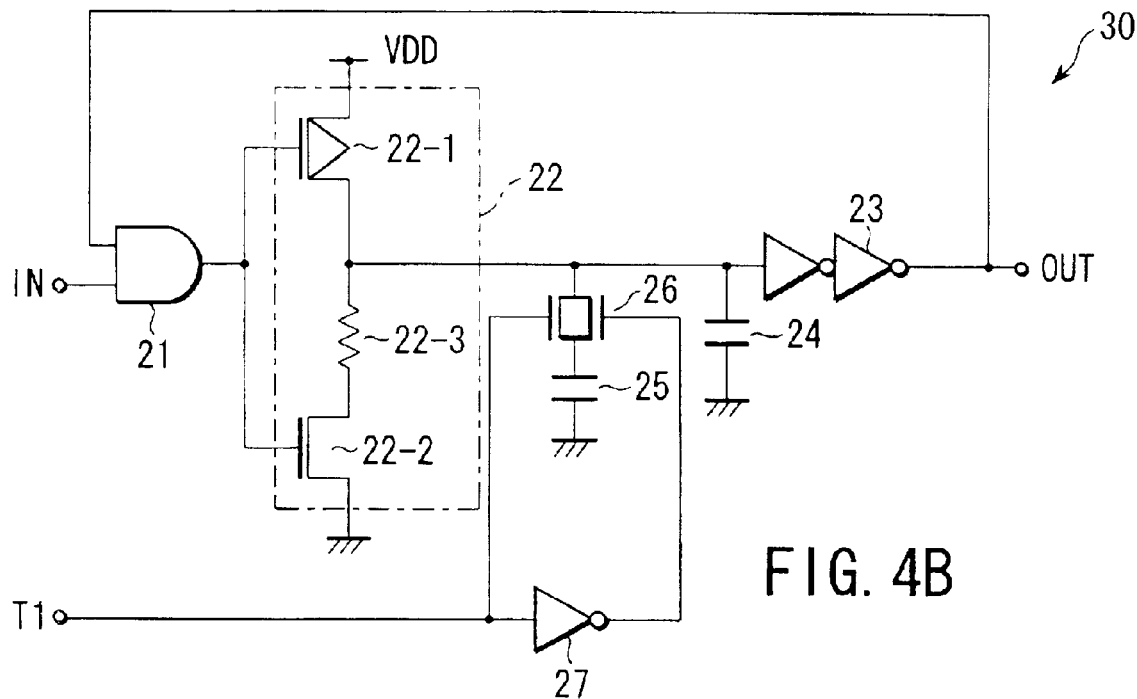
FIG. 4B is a circuit diagram of a clock generator.

FIG. 4B is a circuit diagram of a clock generator 30 in the function block FNC_BLK. The clock generator 30, which corresponds to the clock generator 20 of the first embodiment, includes capacitor elements 24 and 25, a switch 26, and an inverter 27. The capacitor element 24 is arranged between the output node of a delay section 22 and a ground potential. The capacitor element 25 is provided between the output node of the delay section 22 and the ground potential with the switch 26 interposed between the output node and the capacitor element 25. The inverter 27 receives a test command signal T1 and applies a voltage to the switch 26 in response to the test command signal T1.

An operation of the clock generator 30 with the above configuration will now be described. Since a basic operation of the clock generator has been described in the foregoing first embodiment, an operation different from that of the clock generator of the first embodiment will be described here. When the DRAM macro A20 is tested, the test circuit macro A11 supplies the DRAM macro A20 with a control signal for controlling the frequency of a clock generated by the clock generator 30. The control signal is decoded by the control circuit CTRL of the DRAM block DRAM_BLK or the clock control circuit block CTRL_BLK in the DRAM macro A20. Based on a result of the decoding, the clock control circuit block CTRL_BLK supplies a test command signal T1 to the clock generator 30 in the function block FNC_BLK. Consequently, a voltage applied to the switch 26 is varied with the control signal supplied from the test circuit macro A11 to control the frequency of the clock generated by the clock generator 30.

In the DRAM macro according to the second embodiment described above, the clock generator that forms part of a test circuit is provided in the function block FNC_BLK. The same advantage as that of the first embodiment can thus be obtained. The clock control circuit block CTRL_BLK is also provided in order to control the clock generator 30 in the function block FNC_BLK. Consequently, the frequency and pulse width of an internal clock signal generated by the clock generator 30 can freely be changed by the control signal supplied from the test circuit block A11. If the control signal is decoded in the DRAM macro A20, the number of wires between the macros A20 and A11 can be reduced. In the second embodiment, the test circuit macro A11 supplies a signal to the clock control circuit block CTRL_BLK through the control circuit CTRL. However, the signal can be supplied directly to the clock control circuit block CTRL_BLK.

Figure 5A:
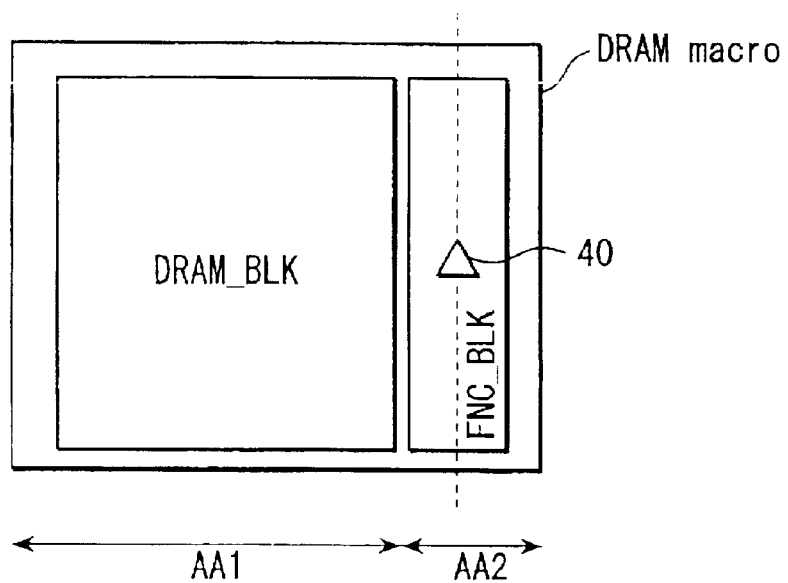
FIG. 5A is a block diagram of a DRAM macro according to a third embodiment of the present invention.

A semiconductor device according to a third embodiment of the present invention will now be described with reference to FIG. 5A. FIG. 5A is a block diagram of a DRAM macro.

Referring to FIG. 5A, the DRAM macro includes a DRAM block DRAM_BLK and a function block FNC_BLK. The DRAM block DRAM_BLK is a collection of components necessary for fulfilling a function of a DRAM and has the same configuration as that of the DRAM block of each of the first and second embodiments.

The function block FNC_BLK is a collection of components for fulfilling a function that totally differs from that of the DRAM and includes a buffer 40. As in the first embodiment, the function block FNC_BLK is functionally completely independent of the DRAM block DRAM_BLK, and no signals are transferred between them.

Figure 5B:
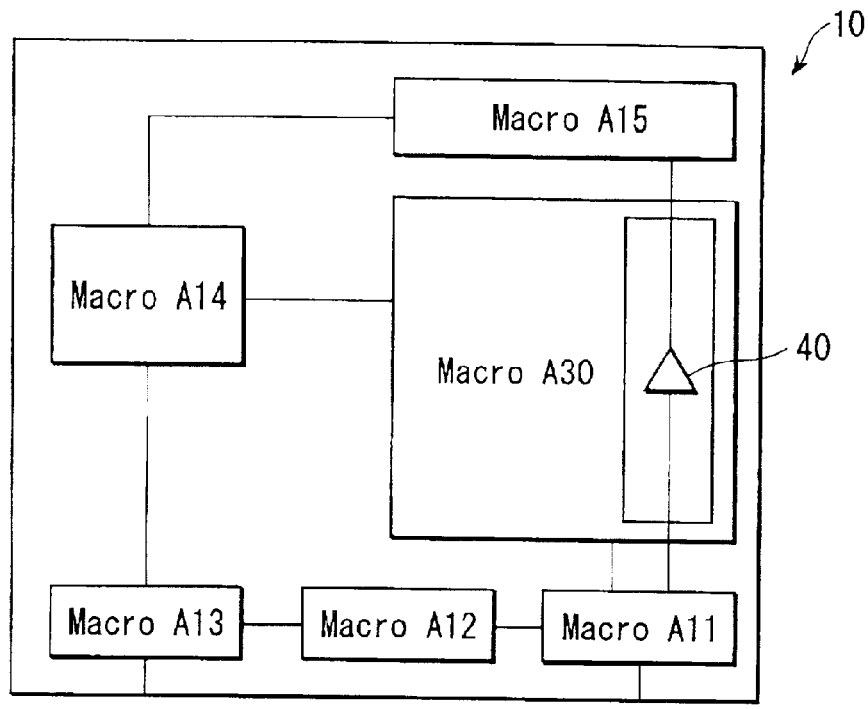
FIG. 5B is a block diagram of a system LSI according to the third embodiment of the present invention.

FIG. 5B is a block diagram of a system LSI 10 including the DRAM macro shown in FIG. 5A. As illustrated in FIG. 5B, the system LSI 10 has macros A30 and A11 to A15. The macro A30 corresponds to the DRAM macro shown in FIG. 5A. To connect the macros A11 and A15 by the shortest connection wire, the connection wire has to pass over the DRAM macro A30. The wire passing over the DRAM macro A30 is formed through the buffer 40 provided in the function block FNC_BLK in the DRAM macro A30.

Figure 5C:
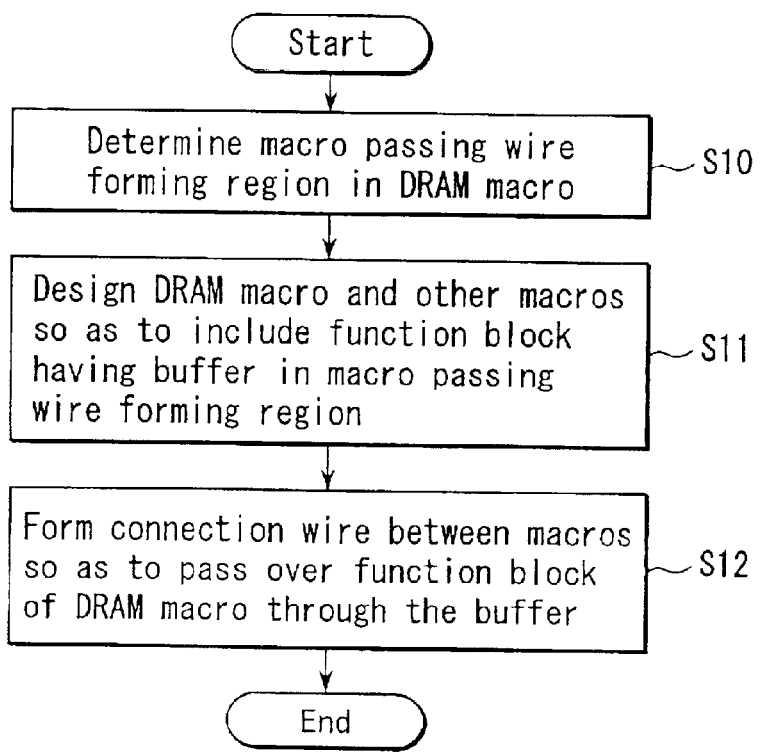
FIG. 5C is a flowchart showing a process of designing the system LSI according to the third embodiment of the present invention.

A process of designing the system LSI shown in FIG. 5B will now be described with reference to FIG. 5C. FIG. 5C is a flowchart of the process.

First, an area in which a wire passing over the DRAM macro (macro A30) is to be formed is determined in step S10. This area corresponds to the area shown in FIG. 5A and including the function block FNC_BLK. In the third embodiment, the function block FNC_BLK is positioned on one side of the DRAM macro A30; however, the position is not limited specifically but can be located in the central part of the DRAM macro.

In step S11, the DRAM macro and the other macros A11 to A15 are designed. The DRAM macro A30 is designed so as to include the function block FNC_BLK with the buffer 40.

In step S12, a connection wire is formed between the macros. A connection wire connecting the macros A11 and A15 is formed so as to pass over the DRAM macro A30 through the buffer 40.

In the forgoing system LSI and its design method, the buffer 40 is provided in the function block FNC_BLK and the macro passing wire is formed through the buffer 40. A signal transmitted through the macro passing wire is therefore wave-shaped by the buffer 40. It is thus possible to prevent the waveform of the signal from being dulled and thus transmit an internal clock with high precision. The system LSI can be improved in operation reliability accordingly. An area AA1 including the function block FNC_BLK is predetermined as an area in which the macro passing wire is to be formed. Thus, the other area AA2 need not be prevented from being freely used as a wiring area in the DRAM block DRAM_BLK. The design of the DRAM macro can thus be simplified.

Figure 6A:
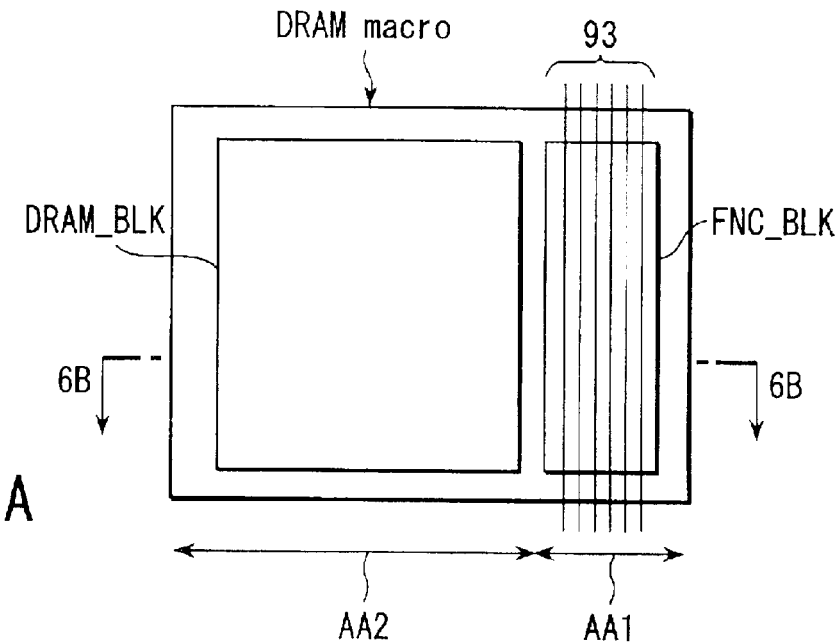
FIG. 6A is a block diagram of a DRAM macro according to a fourth embodiment of the present invention.

A semiconductor device according to a fourth embodiment of the present invention will now be described with reference to FIG. 6A. FIG. 6A is a block diagram of a DRAM macro.

In the DRAM macro shown in FIG. 6A, a plurality of wires 93 are formed in the function block FNC_BLK in place of the buffer 40 of the third embodiment. It is needless to say that these wires are independent of the DRAM block DRAM_BLK.

Figure 6B:
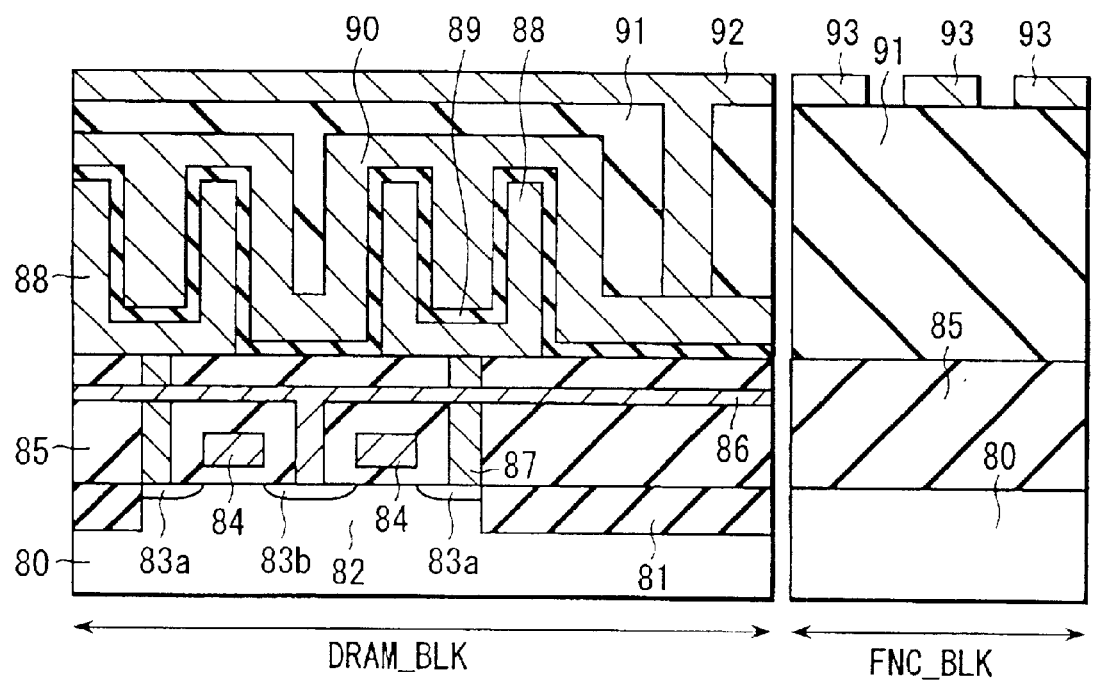
FIG. 6B is a cross-sectional view taken along line 6B—6B of FIG. 6A.

FIG. 6B is a cross-sectional view taken along line 6B—6B in FIG. 6A, particularly showing a section of a memory cell array in the DRAM block DRAM_BLK. First, the structure of the DRAM block DRAM_BLK will be described. Referring to FIG. 6B, a silicon substrate 80 includes an element isolation region 81. An element region 82 surrounded with the element isolation region 81 includes source and drain regions 83a and 83b that are separated from each other. A gate electrode 84 is formed between the source and drain regions 83a and 83b and on the silicon substrate 80 with a gate insulation film (not shown) interposed therebetween. Thus, two cell transistors each having the gate electrode 84 and source and drain regions 83a and 83b are arranged in one element region. These two cell transistors have the drain region 83b in common. An interlayer insulation film 85 is formed on the silicon substrate 80 so as to coat the cell transistors, and a bit line 86 electrically connected to the drain region 83b of the cell transistors is formed in the interlayer insulation film 85. A cell capacitor is formed on the interlayer insulation film 85. The cell capacitor includes a stacked storage node electrode 88 electrically connected to the source region 83a of the cell transistors through a contact plug 87, a capacitor insulation film 89 formed on the storage node electrode 88, and a plate electrode 90 formed on the capacitor insulation film 89. An interlayer insulation film 91 is formed above the cell capacitor, and a metal wiring layer 92 electrically connected to the plate electrode 90 is formed on the interlayer insulation film 91.

Then, the structure of the function block FNC_BLK will be described. As shown in FIG. 6B, the interlayer insulation films 85 and 91 are formed in sequence on the silicon substrate 80, and a plurality of metal wiring layers 93 are formed on the interlayer insulation film 91. The metal wiring layer 93 is formed on the same level as that of the metal wiring layer 92 in the DRAM block DRAM_BLK.

Figure 6C:
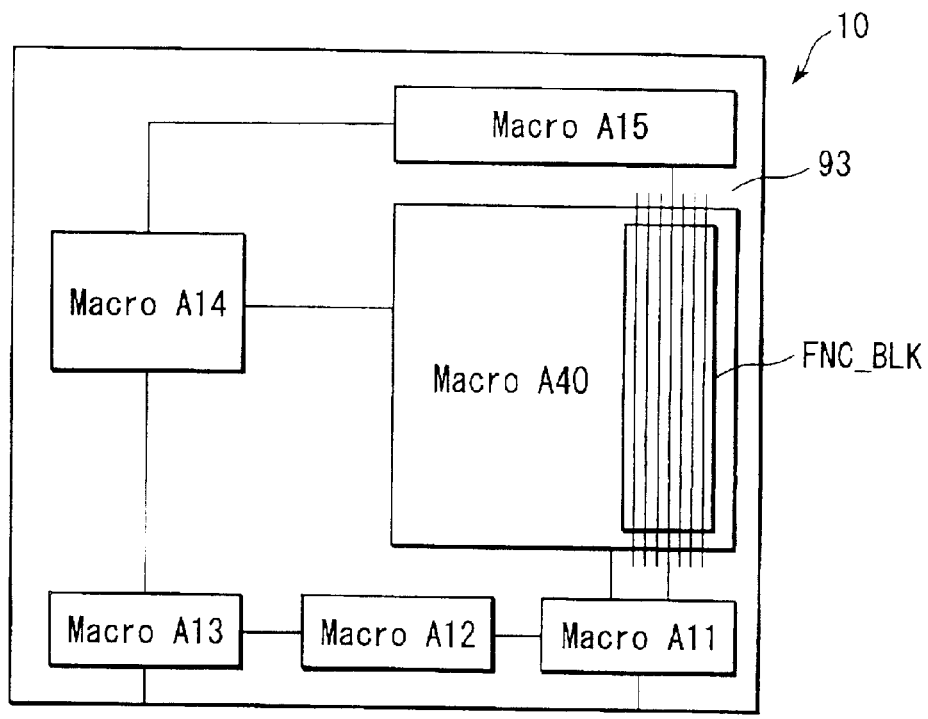
FIG. 6C is a block diagram of a system LSI according to a fourth embodiment of the present invention.

FIG. 6C is a block diagram of a system LSI 10 including the DRAM macro shown in FIGS. 6A and 6B. Referring to FIG. 6C, the system LSI 10 includes macros A40 and A11 to A15. The macro A40 corresponds to the DRAM macro shown in FIGS. 6A and 6B. If the macros A11 and A15 are connected by the shortest connection wire as in the third embodiment, the connection wire has to pass over the macro A40. At least part of a wire formed in the function block FNC_BLK in the macro A40 is used for the connection wire that passes over the macro A40.

Figure 6D:
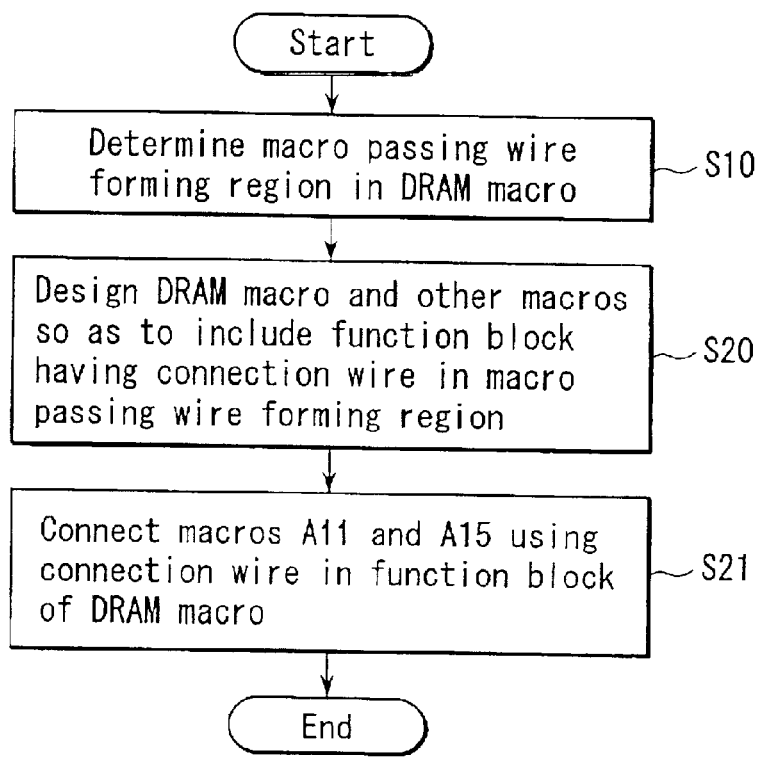
FIG. 6D is a flowchart showing a process of designing the system LSI according to the fourth embodiment of the present invention.

A process of designing the system LSI shown in FIG. 6C will now be described with reference to FIG. 6D. FIG. 6D is a flowchart of the process.

As in the flowchart of the third embodiment, an area in which a wire passing over the DRAM macro (macro A40) is to be formed is determined in step S10. This area corresponds to the area shown in FIG. 6A and including the function block FNC_BLK. In the fourth embodiment, the function block FNC_BLK is positioned on one side of the DRAM macro A40; however, the position is not limited specifically but can be located in the central part of the DRAM macro A40.

In step S20, the DRAM macro A40 and the other macros A11 to A15 are designed. The DRAM macro A40 is designed so as to include the function block FNC_BLK having a plurality of wires.

In step S21, a connection wire is formed between the macros. The wire in the function block FNC_BLK is used as the connection wire between the macros A11 and A15, which passes over the DRAM macro A40.

In the DRAM macro according to the fourth embodiment, the function block FNC_BLK includes a plurality of wires. These wires are used as ones passing over the macro. An area AA1 in which the function block FNC_BLK is provided, is predetermined as an area in which the macro passing wires are to be formed. Consequently, the design of the DRAM macro can be simplified as in the third embodiment. If a number of wires are prepared in the function block FNC_BLK, a difference in wiring density between the area AA1 and wiring area AA2 of the DRAM block DRAM_BLK can be reduced, thereby improving patterning precision of wiring during the manufacture of the system LSI. Needless to say, not all the wires prepared in the function block FNC_BLK need to be used as macro passing wires. The wires not used as macro passing wires have only to be fixed at, for example, a ground potential as dummies. Furthermore, the wires in the function block FNC_BLK are arranged on the same level as that of the wiring layer in the DRAM block DRAM/BLK. Both the wires and wiring layer can thus be patterned in the same step and accordingly a manufacture process can be simplified.

Figure 6E:
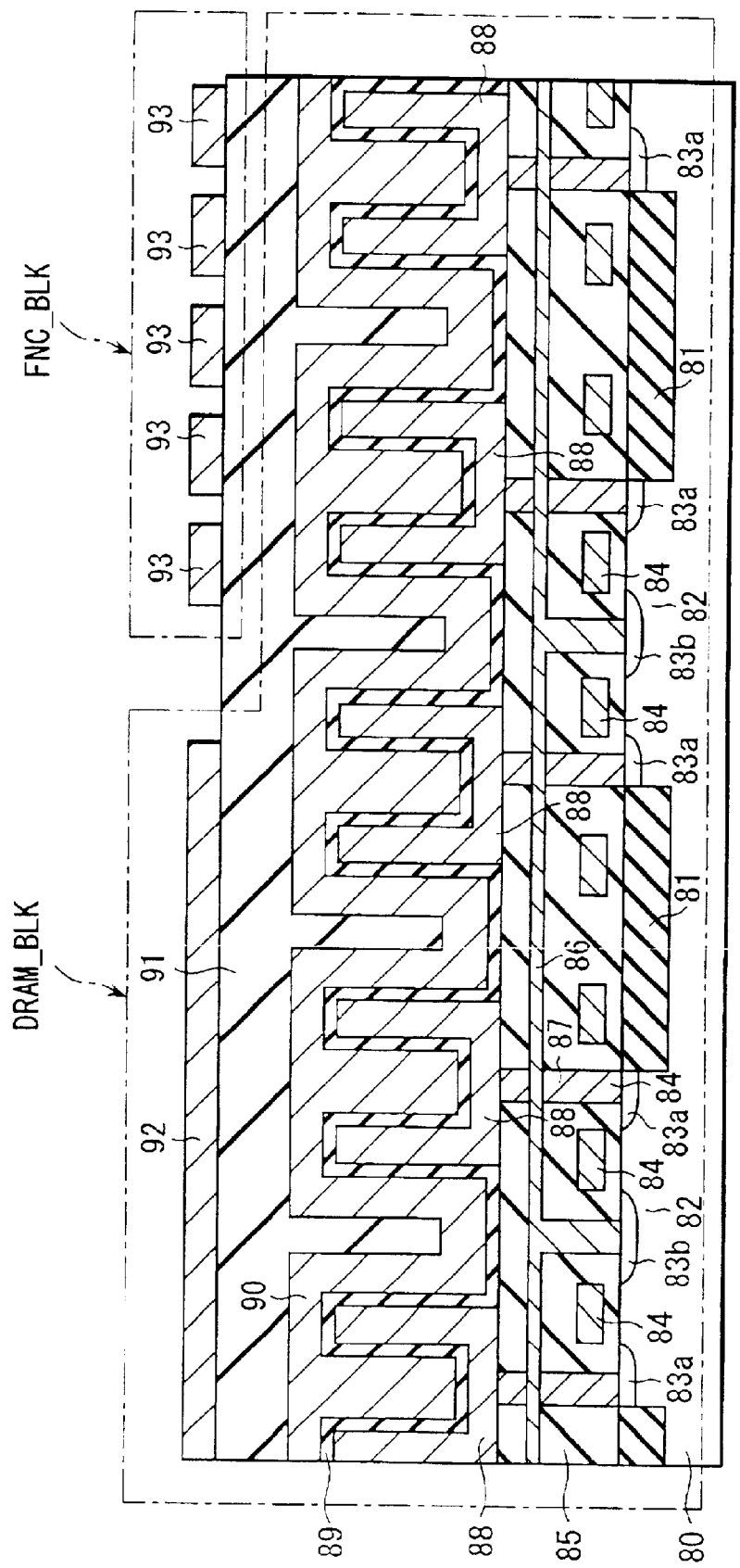
FIG. 6E is a cross-sectional view of the DRAM macro according to a modification to the fourth embodiment of the present invention.

In the DRAM macro shown in FIGS. 6A and 6B, an area under the wires 93 in the function block FNC_BLK is an unused or space one. As is apparent from the section of the DRAM macro shown in FIG. 6E, however, the area under the wires 93 can be used as part of the DRAM block DRAM_BLK and a memory cell can be formed therein.

Figure 7A:
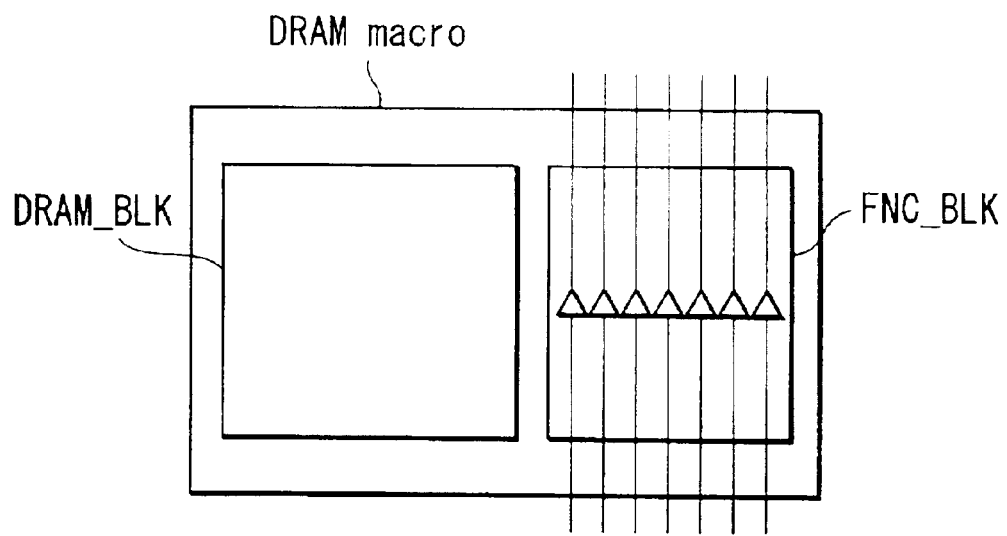
FIG. 7A is a block diagram of a DRAM macro according to a fifth embodiment of the present invention.

A semiconductor device according to a fifth embodiment of the present invention will now be described with reference to FIG. 7A. FIG. 7A is a block diagram of a DRAM macro.

As shown in FIG. 7A, the fifth embodiment is a combination of the third and fourth embodiments described above. To be more specific, a function block FNC_BLK includes a plurality of wires and each of the wires includes a buffer 40.

Figure 7B:
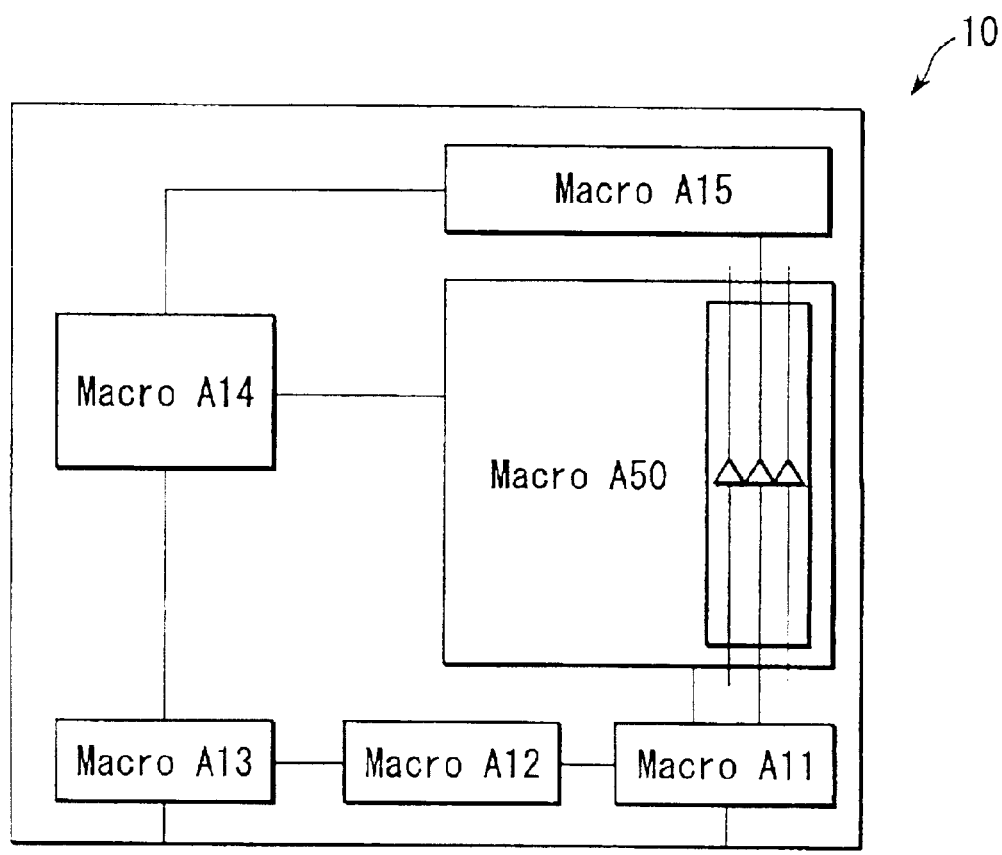
FIG. 7B is a block diagram of a system LSI according to the fifth embodiment of the present invention.

FIG. 7B is a block diagram of a system LSI 10 including the DRAM macro shown in FIG. 7A. The system LSI 10 includes macros A50 and A11 to A15 as shown in FIG. 7B. The macro A50 corresponds to the DRAM macro shown in FIG. 7A. As has been described in the third and fourth embodiments, the wire in the function block FNC_BLK is used as a connection wire between the macros A11 and A15, which passes over the DRAM macro A50.

According to the above arrangement, a signal transmitted through the macro passing wire can be wave-shaped and the patterning precision of the wire can be increased. Since the position of the macro passing wire is predetermined as in the third and fourth embodiments, the design of the DRAM macro can be simplified. Needless to say, as described in the fourth embodiment, not all the wires prepared in the function block FNC_BLK need to be used as macro passing wires. The wires that are to be used as dummies need not always be provided with a buffer 40. To design the system LSI according to the fifth embodiment, the function block FNC_BLK has only to include a buffer and a wire in step S11 shown in FIG. 5C or in step S20 shown in FIG. 6D.

Figure 8A:
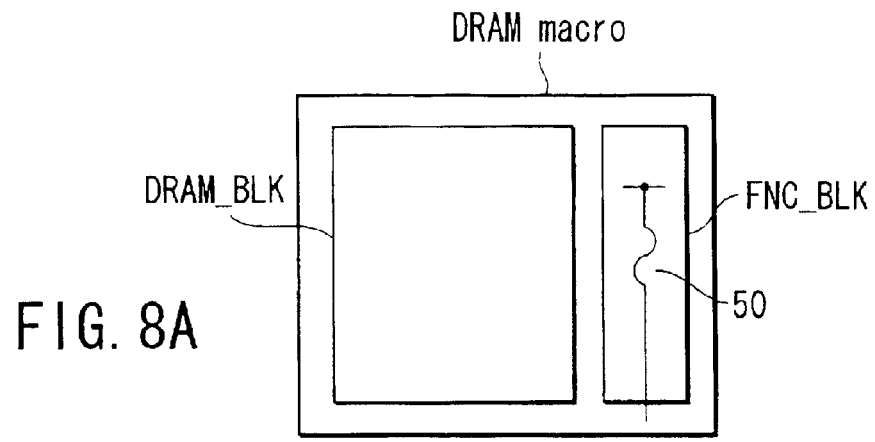
FIG. 8A is a block diagram of a DRAM macro according to a sixth embodiment of the present invention.

A semiconductor device according to a sixth embodiment of the present invention will now be described with reference to FIG. 8A. FIG. 8A is a block diagram of a DRAM macro.

Referring to FIG. 8A, the sixth embodiment includes a fuse element 50 in the function block FNC_BLK in place of the wire and buffer 40 of the third to fifth embodiments. Needless to say, the fuse element 50 does not transmit or receive a signal to or from the DRAM block DRAM_BLK.

Figure 8B:
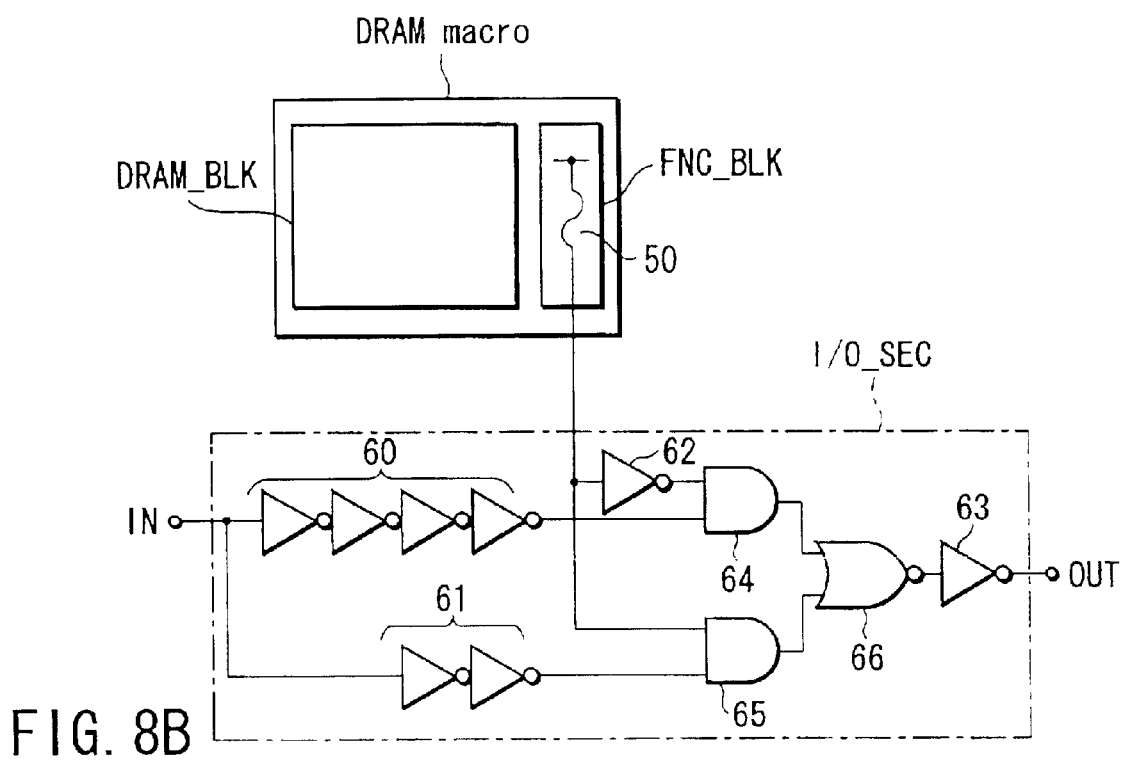
FIG. 8B is a circuit diagram of the DRAM macro according to the sixth embodiment of the present invention and its peripheral circuit.

According to the DRAM macro so configured, input timing of signals can finely be adjusted. This feature will be described with reference to FIG. 8B. FIG. 8B is a circuit diagram of a DRAM macro and an input/output circuit connected to the function block in the DRAM macro.

The function block FNC_BLK includes a fuse element 50 one end of which is connected to a power supply potential and the other end of which is connected to the input/output circuit. Assume that fuse data is "0" when the fuse element is blown and fuse data is "1" when it is not blown.

The input/output circuit I/O_SEC includes inverter groups 60 and 61, inverters 62 and 63, AND gates 64 and 65, and a NOR gate 66. The inverter group 60 has four inverters connected in series, and the inverter group 61 has two inverters connected in series. Each of the inerter groups 60 and 61 is connected to an input terminal IN of the input/output circuit and supplied with an input signal. The input node of the inverter 62 is connected to the other end of the fuse element 50. The AND gate 64 has two input nodes connected to the output nodes of the inverter group 60 and inverter 62 and performs an AND operation for signals supplied from both the input nodes. The AND gate 65 has two input nodes connected to the output nodes of the inverter group 61 and fuse element 50 and performs an AND operation for signals supplied from both the input nodes. The NOR gate 66 has two input nodes connected to the output nodes of the AND gates 64 and 65 and performs a NOR operation for signals supplied from both the input nodes. The inverter 63 inverts the output signal of the NOR gate 66 and supplies an output signal from an output terminal OUT.

In the foregoing circuit, when the fuse element 50 in the function block FNC__BLK is blown, the output of the AND gate 65 is always "0." In other words, a path extending from the input terminal IN to the AND gate 65 via the inverter group 61 is not selected but a path extending from the input terminal IN to the AND gate 64 via the inverter group 60 is selected. When the fuse element 50 is not blown, the output of the AND gate 64 is always "0" and the pas extending to the AND gate 65 via the inverter group 61 is selected.

In other words, the inverter groups 60 and 61 in the transmission paths of input signals are switched to each other according to the states of the fuse element 50. The delay time required until an input signal reaches the output terminal OUT from the input terminal IN is varied with the states of the fuse element. It is thus possible to finely adjust the input timing of signals.

Since the input/output circuit I/O__SEC is a logic circuit as shown in FIG. 8B, it is preferable to design the circuit by the automatic design method using, e.g., a standard cell, whereas the fuse element 50 is difficult to achieve by the automatic design method. In the sixth embodiment, however, the fuse element 50 is provided in the function block FNC__BLK that can be designed by the manual design method. Thus, the input/output I/O__SEC is designed by the automatic design method, and the fuse element can be used as one of components of the input/output I/O__SEC. In other words, if some of the components are provided in the function block and the main components are designed by the automatic design method, the degree of freedom in design of the input/output I/O__SEC can be improved and the period of design can be shortened.

Figure 9A:
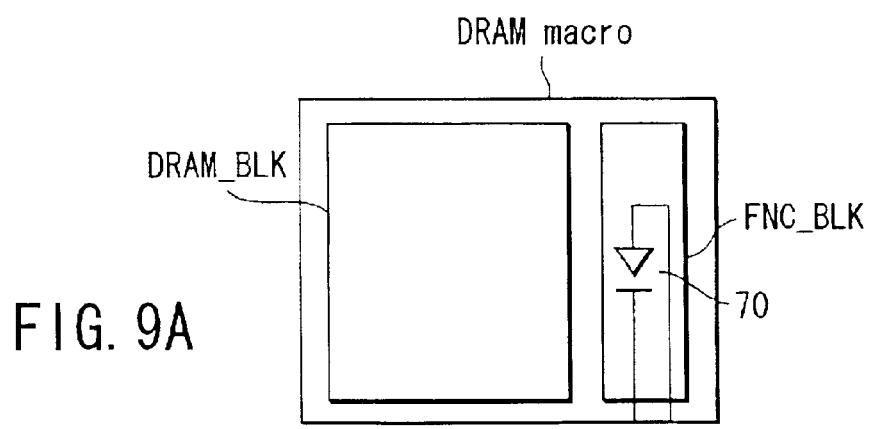
FIG. 9A is a block diagram of a DRAM macro according to a seventh embodiment of the present invention.

A semiconductor device according to a seventh embodiment of the present invention will now be described with reference to FIG. 9A. FIG. 9A is a block diagram of a DRAM macro.

Figure 9B:
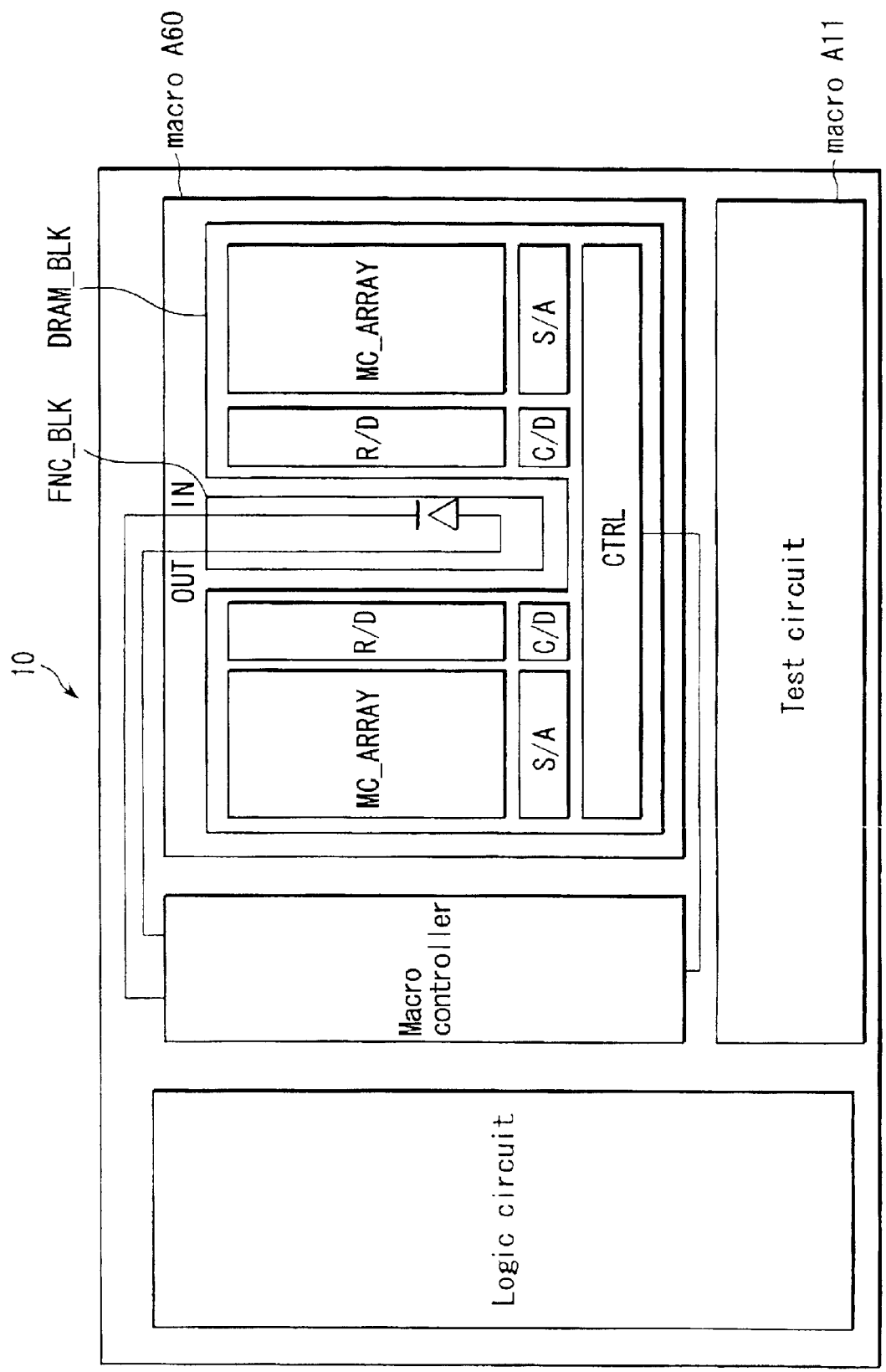
FIG. 9B is a block diagram of a system LSI according to the seventh embodiment of the present invention.

As illustrated in FIG. 9A, the DRAM macro according to the seventh embodiment includes a fixed-potential generation circuit 70 in the function block FNC__BLK in place of the wire, buffer 40 and fuse element 50 of the third to sixth embodiments. Needless to say, the fixed-potential generation circuit 70 does not transmit or receive a signal to or from the DRAM block DRAM__BLK or a voltage generated from the circuit 70 is not applied to the DRAM block DRM__BLK. The fixed-potential generation circuit 70 functions as index of specifications of the DRAM macro. The function of the circuit 70 will be described with reference to FIG. 9B. FIG. 9B is a block diagram of a system LSI 10.

As shown in FIG. 9B, the system LSI 10 comprises a DRAM macro A60, test circuit macros A11 and A12, a macro controller, and a logic circuit. The DRAM macro A60 includes a collection of circuits necessary for composing a DRAM. In other words, the DRAM macro A60 includes a DRAM block DRAM__BLK and a function block FNC__BLK. Since the DRAM block DRAM__BLK has the same configuration as that of the DRAM block of the first embodiment, its description is omitted. The function block FNC__BLK is a collection of components for fulfilling a function that completely differs from that of the DRAM and includes the fixed-potential generation circuit 70. The circuit 70 generates a potential corresponding to the specifications of the DRAM block DRAM__BLK contained in the DRAM macro A60, such as memory capacity.

The test circuit macros A11 and A12 are the same as those of the first embodiment.

The macro controller controls an operation of the DRAM macro, especially an operation of the DRAM block DRAM__BLK irrespective of whether it is in a normal operation mode or a test operation mode. The potential generated by the fixed-potential generation circuit 70 in the function block FNC__BLK is applied to the macro controller. The macro controller recognizes the specifications of the DRAM block DRAM-BLK by the potential generated by the circuit 70 and controls the operation of the DRAM block DRAM__BLK in accordance with the specifications.

Figure 9C:
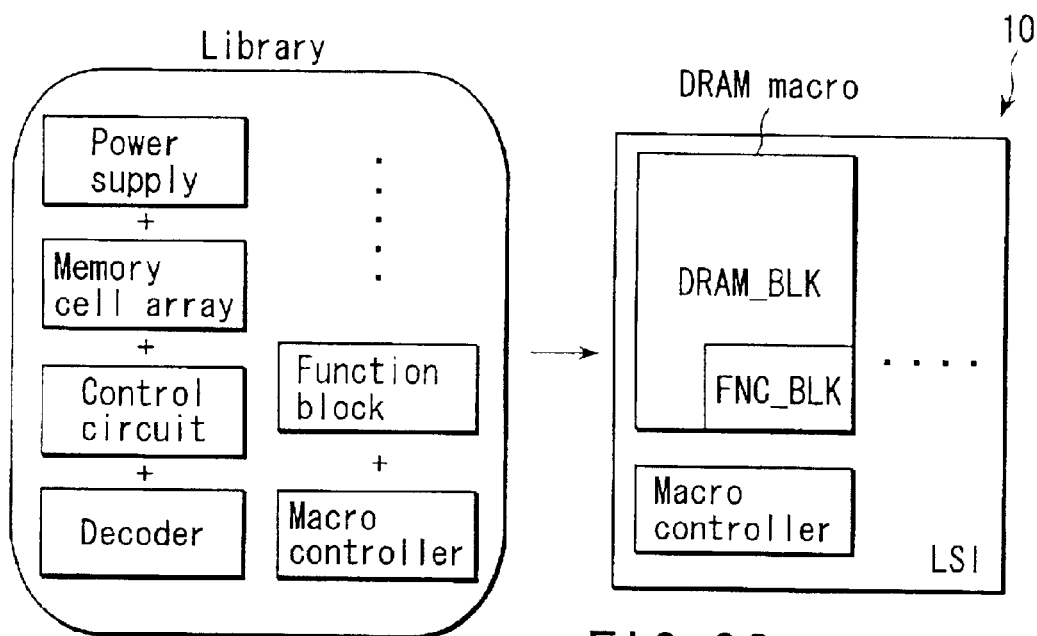
FIG. 9C is a conceptual diagram showing a model of a process of designing the system LSI according to the seventh embodiment of the present invention.

According to the system LSI of the seventh embodiment described above, the function block FNC__BLK includes the fixed-potential generation circuit 70, which generates a fixed potential based on the specifications of the DRAM. The design of the system LSI can thus be simplified. This feature will be described with reference to FIG. 9C. FIG. 9C is a conceptual diagram showing a process of designing the DRAM macro.

An LSI is usually designed on software using a computer. The software used for designing a DRAM includes a library in which the components of the DRAM, such as a memory cell array and a decoder, are registered as parts. The DRAM having a desired configuration is therefore designed using a required number of parts registered in the library. Adopting such a design method, the structure of the DRAM, such as capacitance, address components, and the number of banks can be varied with a customer's request.

As described above, the macro controller is required in order to control the DRAM macro. The control of each DRAM macro by the macro controller varies with the structure of the DRAM macro. For this reason, conventionally, a general-purpose macro controller could not be designed, but a macro controller had to be designed for each of the DRAM macros. According to the seventh embodiment, the macro controller can recognize the structure of the macro of the DRAM by varying the potential generated by the fixed-potential generation circuit in accordance with the structure of the macro of the DRAM. A macro controller need not be designed for each DRAM macro but a general-purpose macro controller can be used. Thus, the macro controller can be treated as one part in the library like a memory cell array.

According to the seventh embodiment described above, a macro controller need not be designed for each macro by supplying information corresponding to the internal structure of the macro from the function block FNC__BLK to the macro controller. Consequently, the design of the system LSI can be simplified.

In the system LSI according to the first to seventh embodiments of the present invention, a function block, which is functionally independent of a macro having a specific function, is provided in the macro, as described above. Some of other macros designed by the automatic design method are extracted and incorporated into the function block, and the macro including the function block is designed by the manual design method. In other words, the macro, which was conventionally designed by the automatic design method, is designed by two design methods of the automatic design method and manual design method using a function block of another macro. The use of the manual design method allows a macro to be designed on the level of transistor elements, resistance elements, capacitance elements, and the like in the function block. The function of the macro can thus be extended. However, the elements formed in the function block are not limited to the clock generator, fuse element, fixed-potential generator, or the like, which is described in the foregoing embodiments. A logic circuit can be formed in the function block. Moreover, the function block serves as an area where a macro passing wire is formed; therefore, the waveform of a signal transmitted through the macro passing wire can be improved and so can be the reliability of the manufacture process.

Figure 10A:
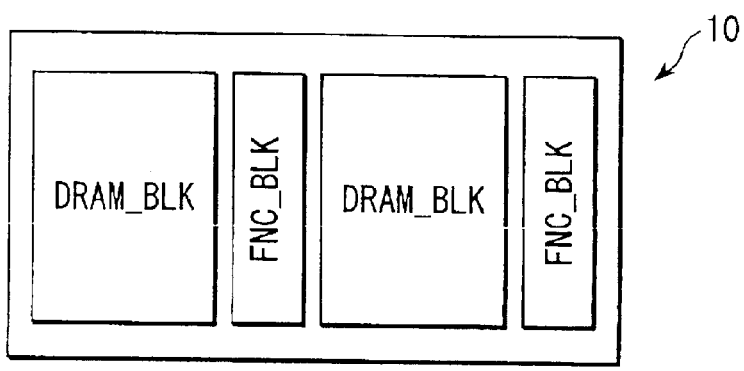
FIG. 10A is a block diagram of a DRAM macro according to a modification to the first to seventh embodiments of the present invention.
Figure 10B:
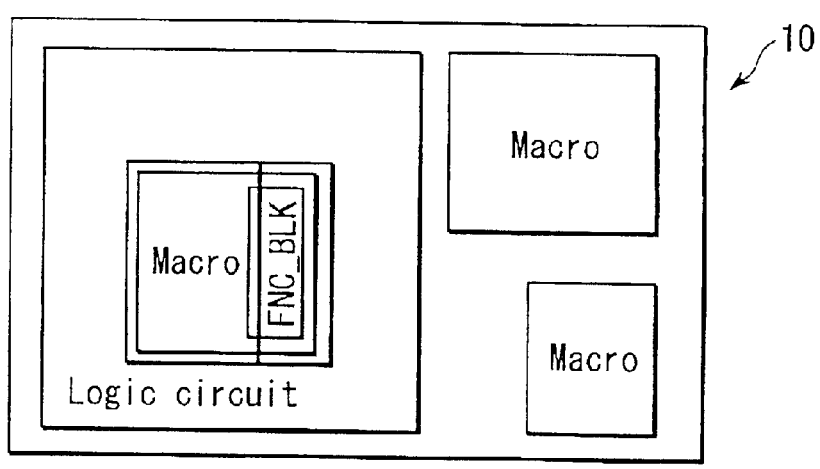
FIG. 10B is a block diagram of a system LSI according to a modification to the first to seventh embodiments of the present invention.

A plurality of function blocks FNC_BLK can be provided in the macro 10 as illustrated in FIG. 10A. When the function block FNC_BLK is used as an area in which a macro passing wire is formed, the macro passing wire is not limited to one connecting macros but can be used as one connecting logic circuits as shown in FIG. 10B. In the above embodiments, the DRAM block DRAM_BLK and function block FNC_BLK are designed by the same design method. However, both the blocks can be designed by different design methods. For example, the DRAM block DRAM_BLK can be designed by the manual design method, while the function block FNC_BLK can be designed by the automatic design method. Furthermore, a plurality of components can be extracted from one macro and provided in the function block FNC_BLK in a plurality of macros. The first to seventh embodiments are directed to the DRAM macro. However, the embodiment of the present invention is not limited to the DRAM macro but another memory macro such as an SRAM and a flash memory can be used. A macro such as a CPU as well as the memory macro can also be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor circuit having a first function;
   a second semiconductor circuit having a second function different from the first function; and
   a third semiconductor circuit provided in the second semiconductor circuit and having part of the first function, the third semiconductor circuit transmitting/receiving no signals to/from the second semiconductor circuit and operating independently of the second semiconductor circuit.

2. The semiconductor device according to claim 1, wherein a signal input to/output from the second semiconductor circuit has no influence on an operation of the third semiconductor circuit.

3. The semiconductor device according to claim 1,
   wherein the third semiconductor circuit includes a clock generator which generates a clock, the clock generator includes a delay circuit which determines a pulse width of the clock, and
   wherein at least part of the first semiconductor circuit operates in response to the clock.

4. The semiconductor device according to claim 1, wherein the first semiconductor circuit includes part of a clock generator, and the third semiconductor circuit includes a delay circuit which determines a pulse width of a clock generated by the clock generator, and at least part of the first semiconductor circuit, which is different from a region that forms the clock generator, operates in response to the clock.

5. The semiconductor device according to claim 3, further comprising a fourth semiconductor circuit provided in the second semiconductor circuit and having a third function, the fourth semiconductor circuit operating when the second semiconductor circuit is tested and controlling delay time of the delay circuit of the third semiconductor circuit in accordance with a command issued from the second semiconductor circuit.

6. The semiconductor device according to claim 1, wherein the second semiconductor circuit serves as a semiconductor memory and the first semiconductor circuit serves as a test circuit which tests a function of the semiconductor memory of the second semiconductor circuit.

7. The semiconductor device according to claim 1, wherein the third semiconductor circuit includes a fuse element, and an operation of the first semiconductor circuit is controlled by data written to the fuse element.

8. The semiconductor device according to claim 1, wherein the third semiconductor circuit includes a fixed-potential output circuit which outputs a fixed potential corresponding to specifications of the second semiconductor circuit, and the first semiconductor circuit includes a control circuit which controls an operation of the second semiconductor circuit based on the fixed potential.

9. The semiconductor device according to claim 1, wherein the second semiconductor circuit is rectangular.

10. The semiconductor device according to claim 1, wherein the first semiconductor circuit is designed by an automatic design method, and the second and third semiconductor circuits are designed by a manual design method.

11. A semiconductor device comprising:
    a first semiconductor circuit having a first function;
    a second semiconductor circuit having a second function, the second semiconductor circuit transmitting/receiving signals to/from the first semiconductor circuit;
    a third semiconductor circuit having a third function different from the first and second functions, the third semiconductor circuit being arranged so as to be interposed between the first and second semi-conductor circuits; and
    a fourth semiconductor circuit provided in the third semiconductor circuit, the fourth semiconductor circuit transmitting/receiving no signals to/from the third semiconductor circuit and operating independently of the third semiconductor circuit, and the fourth semiconductor circuit including part of a connection wire which connects the first and second semiconductor circuits.

12. The semiconductor device according to claim 11, wherein wiring density of the connection wire included in the fourth semiconductor circuit is substantially equal to that of a metal wiring layer included in the third semiconductor circuit.

13. The semiconductor device according to claim 11, wherein the fourth semiconductor circuit includes a buffer, the buffer shaping a waveform of a signal transmitted through the connection wire.

14. The semiconductor device according to claim 11, wherein the connection wire included in the fourth semiconductor circuit is formed on a same level as that of the metal wiring layer included in the third semiconductor circuit.

15. A method for designing a semiconductor device comprising:
    determining a first semiconductor circuit necessary for composing a first semiconductor circuit group which fulfils a first function and a plurality of second semiconductor circuits necessary for composing a second semiconductor circuit group which fulfils a second function;

selecting a second semiconductor circuit, which is to be designed by a same design method as that of the first semiconductor circuit group, from the second semiconductor circuit group; and designing the first semiconductor circuit group including the selected second semiconductor circuit by a first design method and designing the second semiconductor circuit group excluding the selected second semiconductor circuit by a second design method, the second design method differing from the first design method, and the second semiconductor circuit in the first semiconductor circuit group transmitting/receiving no signals to/from the first semiconductor circuit and being independent of the first semiconductor circuit.

16. The method according to claim 15, wherein the selected second semiconductor circuit is at least part of a clock generator and designed using at least one of a transistor, a resistance element, and a capacitance element.

17. The method according to claim 15, wherein the first design method is a manual design method and the second design method is an automatic design method.

18. A method for designing a semiconductor device comprising:

designing a first semiconductor circuit group including a first semiconductor circuit which fulfils a first function, a second semiconductor circuit group including a second semiconductor circuit which fulfils a second function, and a third semiconductor circuit group including a third semiconductor circuit which fulfils a third function different from the first and second functions and a fourth semiconductor circuit which transmits/receives no signals to/from the third semiconductor circuit;

arranging the first, second and third semiconductor circuit groups, the third semiconductor circuit group being interposed between the first and second semiconductor circuit groups; and forming a connection wire connecting the first and second semiconductor circuit groups such that the connection wire passes over the fourth semiconductor circuit in the third semiconductor circuit group.

19. The method according to claim 18, wherein the fourth semiconductor circuit includes a buffer and the buffer is provided in the connection wire.

20. The method according to claim 18, wherein part of the connection wire is provided in advance in the fourth semiconductor circuit when the third semiconductor circuit group is designed.

21. The method according to claim 20, wherein wiring density of the connection wire in the fourth semiconductor circuit is substantially equal to that of a metal wiring layer in the third semiconductor circuit.

* * * * *